(12) United States Patent
Masuda

(10) Patent No.: US 8,558,930 B2
(45) Date of Patent: Oct. 15, 2013

(54) SOLID-STATE IMAGE SENSING DEVICE AND IMAGE PICKUP APPARATUS

(75) Inventor: Satoshi Masuda, Neyagawa (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 173 days.

(21) Appl. No.: 12/628,565

(22) Filed: Dec. 1, 2009

(65) Prior Publication Data

US 2010/0134673 A1    Jun. 3, 2010

(30) Foreign Application Priority Data

Dec. 3, 2008  (JP) .................................. 2008-308294

(51) Int. Cl.
*H04N 3/14*    (2006.01)
*H04N 9/04*    (2006.01)

(52) U.S. Cl.
USPC ............................ 348/302; 348/272; 348/308

(58) Field of Classification Search
USPC ......... 348/294, 308, 298, 301, 302, 304, 307, 348/272, 277, 282, 281, 300; 250/208.1
See application file for complete search history.

(56) References Cited

U.S. PATENT DOCUMENTS

| | | | |
|---|---|---|---|
| 7,911,521 B2* | 3/2011 | Kuroda et al. | 348/301 |
| 2006/0044439 A1* | 3/2006 | Hiyama et al. | 348/308 |
| 2007/0018267 A1* | 1/2007 | Altice et al. | 257/445 |
| 2007/0164335 A1* | 7/2007 | McKee | 257/294 |
| 2010/0110245 A1 | 5/2010 | Yamaguchi et al. | |

FOREIGN PATENT DOCUMENTS

| | | |
|---|---|---|
| JP | 2001-024948 | 1/2001 |
| JP | 2001-298177 | 10/2001 |
| JP | 2007-336519 A | 12/2007 |
| WO | WO 2008/133145 | 11/2008 |

OTHER PUBLICATIONS http://jp.hamamatsu.com/products/sensor-ssd/pd101/pd457/index_ja.html.
http://jp.hamamatsu.com/resources/products/ssd/pdf/tdi-ccd_kmpd9004j01.pdf.
Office Action dated Feb. 12, 2013 issued in the corresponding Japanese Patent Application No. 2008-308294.

* cited by examiner

*Primary Examiner* — Tuan Ho
*Assistant Examiner* — Ahmed A Berhan
(74) *Attorney, Agent, or Firm* — Cozen O'Connor

(57) ABSTRACT

Each pixel circuit of one type includes a transfer transistor and the like and is individually provided for and arranged in a corresponding pixel. Each pixel circuit of another type includes an amplifying transistor, a floating diffusion, a reset transistor and the like and is commonly provided for pixels of respective rows and arranged outside pixel rows.

8 Claims, 9 Drawing Sheets

US 8,558,930 B2

SOLID-STATE IMAGE SENSING DEVICE AND IMAGE PICKUP APPARATUS

PRIORITY CLAIM

Priority is claimed on Japanese Patent Application No. 2008-308294 filed on Dec. 3, 2008, the contents of which are hereby incorporated by reference.

BACKGROUND OF THE INVENTION

1. Field of the Invention

The present invention relates to a solid-state image sensing device and an image pickup apparatus including such a solid-state image sensing device.

2. Description of the Background Art

In recent years, there has been known a document reading apparatus including a CMOS image sensing device in which a plurality of linear pixel rows are arranged. For example, Japanese Unexamined Patent Publication No. 2007-336519 discloses a CMOS image sensor in which an arrangement pitch of three pixel rows in a column direction is 4/3 of the width W of a light receiving region in the column direction for the purpose of causing the respective pixel rows to reach the same lines of a document.

In CMOS image sensors of recent years, the sizes of the respective pixels have been reduced in response to a demand for higher resolution, miniaturization and lower cost.

However, in a conventional CMOS image sensor as disclosed in Japanese Unexamined Patent Publication No. 2007-336519, a pixel circuit including a photoelectric conversion element PD, a transfer transistor TQ, a reset transistor RQ, a floating diffusion FD, an amplifying transistor GQ and a row selection transistor SQ is arranged in each pixel as shown in FIG. 11. Thus, each pixel is taken up by the pixel circuit excluding the photoelectric conversion element PD and there is a problem of being unable to ensure a sufficient region (light receiving region) where the photoelectric conversion element PD receives light. Therefore, sufficient photons cannot be taken in, leading to a problem of reducing the sensitivity of the CMOS image sensor.

SUMMARY OF THE INVENTION

An object of the present invention is to provide a solid-state image sensing device and an image pickup apparatus which can suppress the reduction of sensitivity even if the size of pixels is made smaller.

One aspect of the present invention is directed to a solid-state image sensing device in which a plurality of pixel rows each including a plurality of linearly arranged pixels are arranged, comprising first pixel circuits individually provided for the respective pixels and arranged in the respective pixels; and second pixel circuits commonly provided for the pixels of the respective columns, wherein the second pixel circuits are arranged outside the pixel rows.

DESCRIPTION OF THE PREFERRED EMBODIMENTS OF THE INVETION

First Embodiment

Figure 1:
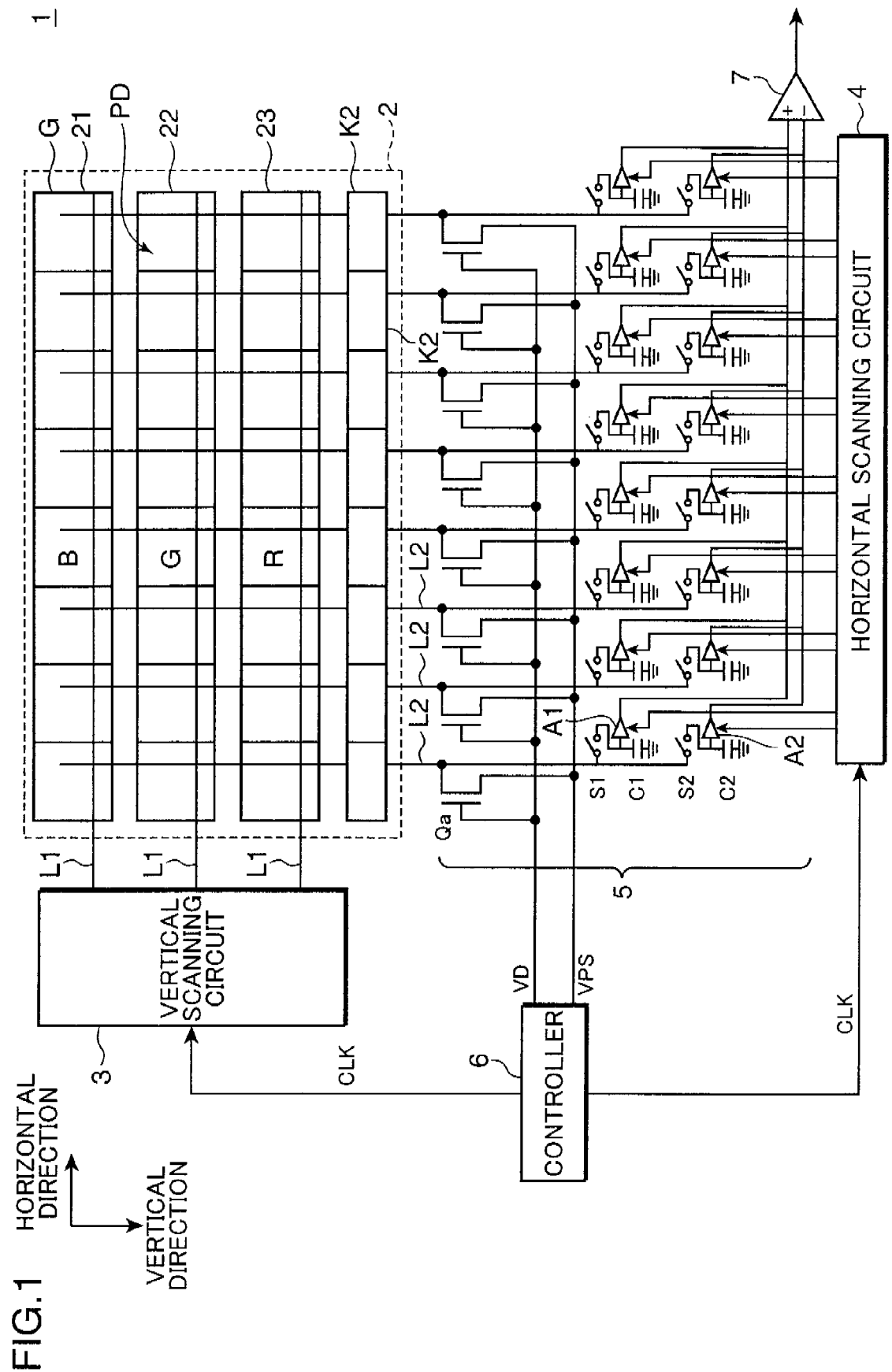
FIG. 1 is a diagram showing an essential part of an image pickup apparatus according to a first embodiment of the invention.

Hereinafter, an image pickup apparatus according to a first embodiment of the present invention is described with reference to the drawings. FIG. 1 is a diagram showing an essential part of an image pickup apparatus 1 according to the first embodiment of the present invention. As shown in FIG. 1, the image pickup apparatus 1 is an image pickup apparatus such as a digital camera or a scanner and provided with a pixel array 2, a vertical scanning circuit 3, a horizontal scanning circuit 4, reading circuits 5, a controller 6 and a differential amplifier 7. The image pickup apparatus 1 scans an object such as a document relatively moving, for example, in a vertical direction (sub scanning direction) or scans a stationary object by relatively moving the pixel array 2 in the vertical direction with respect to the object.

A solid-state image sensing device is constructed by all the elements in FIG. 1 excluding the controller 6, i.e. by the pixel array 2, the vertical scanning circuit 3, the horizontal scanning circuit 4, the reading circuits 5 and the differential amplifier 7. However, if the image pickup apparatus 1 of FIG. 1 is formed by one chip including the controller 6, the solid-state image sensing device may be constructed by all the elements in FIG. 1 including the controller 6.

In FIG. 1, a basic construction of the image sensing device including an operation unit for receiving an input from a user such as a sensing start command, an optical system for introducing an optical image of an object to the pixel array 2, an image processor for applying a specified image processing to sensed image data and an image memory for storing the processed image data is not shown.

The pixel array 2 is a CMOS pixel array including three pixel rows 21 to 23. The pixel rows 21 to 23 are respectively sensors in each of which a plurality of pixels G are linearly arranged in a horizontal direction (main scanning direction). Further, the pixel rows 21 to 23 are respectively such that color filters of B (blue), G (green) and R (red) are mounted in light receiving regions of the respective pixels G to read pixel signals of B, G and R.

The vertical scanning circuit 3 is connected to the pixel rows 21 to 23 via row selection signal lines L1 and cyclically outputs row selection signals for selecting the respective rows of the pixel array 2 to the pixel rows 21 to 23 from the upper side toward the lower side or from the lower side toward the upper side in the vertical direction in accordance with a clock signal CLK output from the controller 6 to vertically scan the respective rows of the pixel array 2. In this embodiment, the vertical scanning circuit 3 is constructed by a shift register, but may be constructed by a random access circuit without being limited thereto.

The horizontal scanning circuit 4 is constructed, for example, by a shift register and cyclically outputs column selection signals for selecting the respective columns of the pixel array 2 to the pixel rows 21 to 23 in accordance with the clock signal CLK output from the controller 6 to scan the reading circuits 5, for example, from the left side toward the right side or from the right side toward the left side. There are a plurality of vertical signal lines L2 in correspondence with the respective columns of the pixel array 2. Each vertical signal line L2 is connected with three pixels G of the corresponding column.

Each reading circuit 5 is commonly provided for the three pixels G of each column of the pixel array 2, and reads pixel signals from the pixel rows 21 to 23 via the vertical signal line L2. Here, each reading circuit 5 includes a load transistor Qa, a signal sample hold switch S1, a noise sample hold switch S2, a signal sample hold capacitor C1, a noise sample hold capacitor C2 and amplifiers A1, A2.

The load transistor Qa is constructed, for example, by a field-effect transistor and has a load voltage signal VD applied to a gate thereof under the control of the controller 6 to function as a load.

The noise sample hold switch S2 reads noise components of the pixel signals from the pixels G of the row selected by the vertical scanning circuit 3 and causes the noise sample hold capacitor C2 to hold them as samples when being turned on under the control of the controller 6. The amplifier A2 outputs the noise components held as the samples by the noise sample hold capacitor C2 to the differential amplifier 7 in accordance with a column selection signal output from the horizontal scanning circuit 4.

The signal sample hold switch S1 reads noise components and signal components of the pixel signals from the pixels G of the row selected by the vertical scanning circuit 3 and causes the noise sample hold capacitor C1 to hold them as samples when being turned on under the control of the controller 6. The amplifier A1 outputs the noise components and the signal components held as the samples by the signal sample hold capacitor C1 to the differential amplifier 7 in accordance with the column selection signal output from the horizontal scanning circuit 4. The differential amplifier 7 takes differences between the noise components output from the amplifier A2 and the noise components and the signal components output from the amplifier A1, removes the noise components from the pixel signals and outputs the pixel signals, for example, to an unillustrated A/D converter provided at a later stage.

The controller 6 is constructed, for example, by a microcomputer including a dedicated hardware circuit, a CPU (central processing unit), a ROM (read-only memory) and a RAM (random access memory) and is responsible for the overall control of the image pickup apparatus 1.

Figure 2:
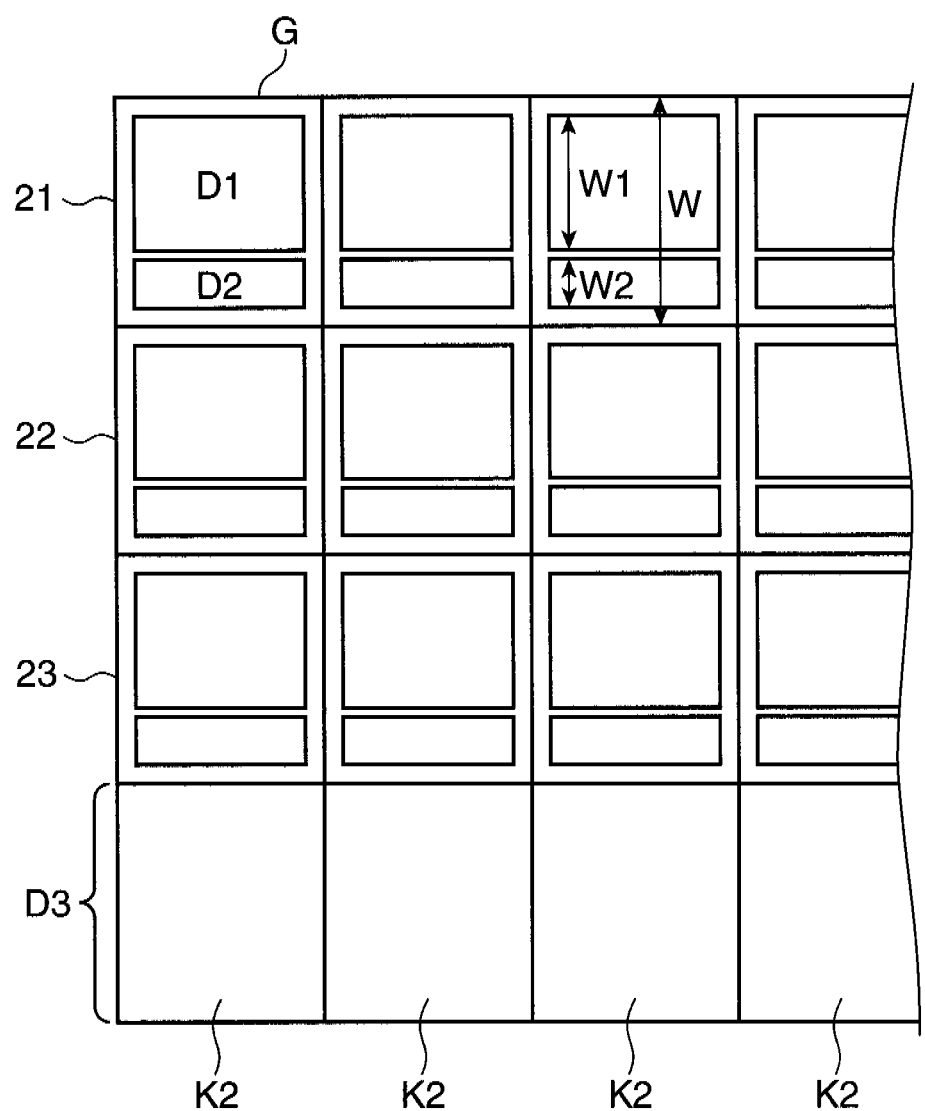
FIG. 2 is a diagram schematically showing an external construction of a pixel array used in the image pickup apparatus.
Figure 3:
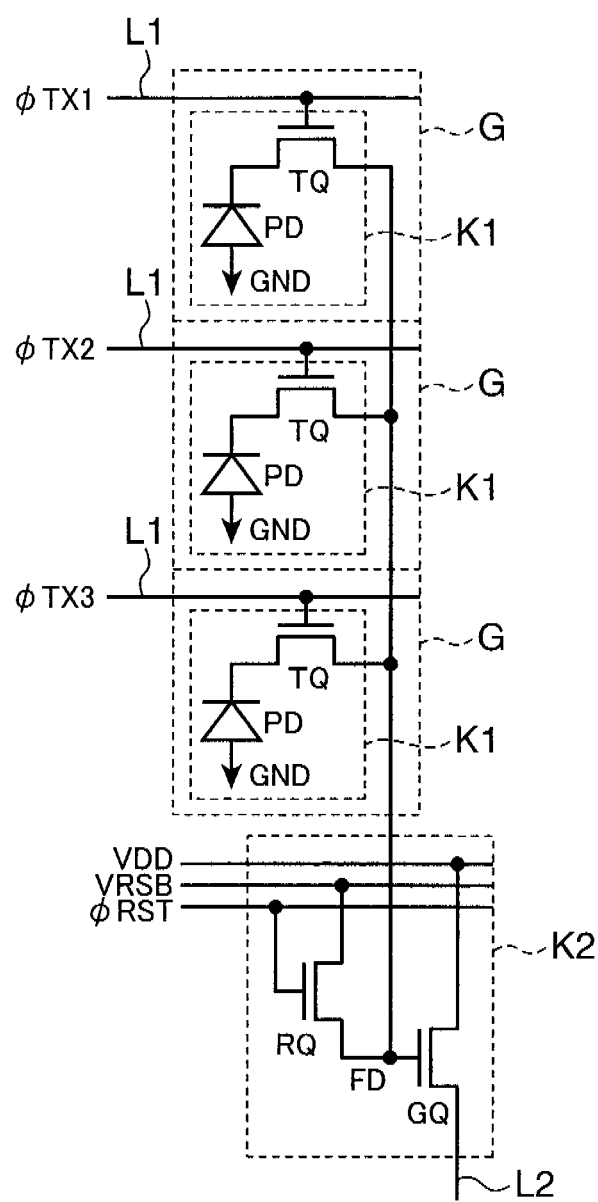
FIG. 3 is a circuit diagram of a pixel of the image pickup apparatus according to the first embodiment of the invention.

FIG. 2 is a diagram schematically showing an external configuration of the pixel array 2 used in the image pickup apparatus 1. FIG. 3 is a circuit diagram of the pixels G of the image pickup apparatus 1 according to the first embodiment of the present invention. As shown in FIG. 2, each pixel G is divided into two rectangular regions D1, D2. A photoelectric conversion element PD shown in FIG. 3 is arranged in the region D1, which serves as a light receiving region of the photoelectric conversion element PD. A pixel circuit K1 excluding the photoelectric conversion element PD is arranged in the region D2. A ratio of a vertical dimension W1 of the region D1 to a vertical dimension W2 of the region D2 is, for example, 3:1. In other words, if a vertical dimension of one pixel row is assumed to be W, W1=($3/4$)·W, W2=($1/4$)·W.

The pixel rows 21 to 23 are arranged from the upper side toward the lower side in the vertical direction, i.e. arranged to be adjacent to each other in the column direction. Thus, an arrangement pitch of the respective pixel rows 21 to 23 in the column direction is: W=(4/3)·W1.

As shown in FIG. 3, a pixel circuit K1 is arranged in each pixel G. The pixel circuit K1 includes the photoelectric conversion element PD and the transfer transistor TQ.

The photoelectric conversion element PD receives light from an object and accumulates signal charges corresponding to the received light quantity. The transfer transistor TQ transfers the signal charges accumulated by the photoelectric conversion element PD.

Here, the photoelectric conversion element PD has an anode thereof grounded and a cathode thereof connected to a source of the transfer transistor TQ. A gate of the transfer transistor TQ is connected to the vertical scanning circuit 3 via the row selection signal line L1 to have a row selection signal input thereto. Row selection signals input to gates of the transfer transistors TQ of the respective pixels G in the first to third rows are expressed by $\phi$TX1 to $\phi$TX3.

A drain of the transfer transistor TQ is connected to a floating diffusion (hereinafter, called an "FD") of a pixel circuit K2 (second pixel circuit).

The pixel circuit K2 is commonly provided for the respective columns of the pixel array 2. In other words, there are as many pixel circuits K2 as the columns of the pixel array 2. The pixel circuit K2 includes the reset transistor RQ, the FD, and the amplifying transistor GQ. The reset transistor RQ has $\phi$RST as a signal for turning the reset transistor RQ on and off input to a gate thereof, has VRSB as a drive voltage input to a source thereof and has a drain thereof connected to a gate of the amplifying transistor GQ via the FD.

The reset transistor RQ is turned on and off under the control of the controller 6 to reset the FD. VRSB is output from an unillustrated voltage source and $\phi$RST is output, for example, from the controller 6.

The amplifying transistor GQ has the gate thereof connected to the transfer transistor TQ and the reset transistor RQ via the FD, has VDD as a drive voltage input to a source thereof and has a drain thereof connected to the reading circuit 5 via the vertical signal line L2. The amplifying transistor GQ amplifies the signal charges accumulated in the FD and outputs them as a pixel signal to the vertical signal line L2. VDD is output, for example, from an unillustrated voltage source.

Figure 11:
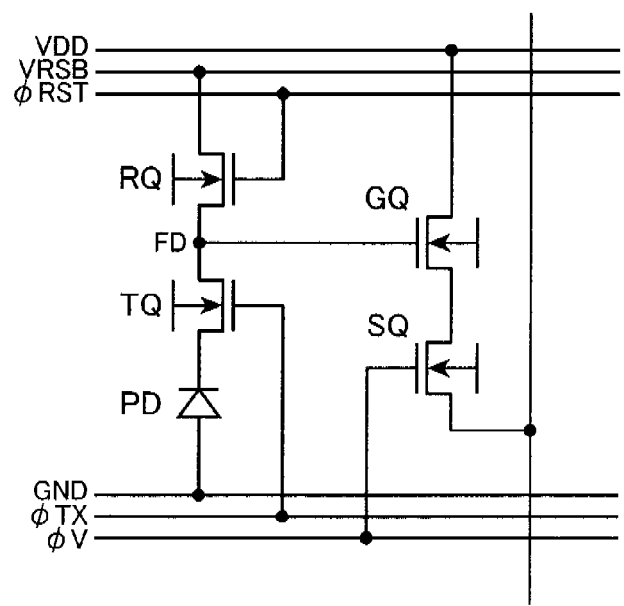
FIG. 11 is a circuit diagram of a conventional pixel circuit.

In the conventional construction, the pixel circuit shown in FIG. 11 is arranged in the region D2 shown in FIG. 2. On the other hand, in the image pickup apparatus 1, only the transfer transistor TQ shown in FIG. 3 is arranged in the region D2, and the reset transistor RQ, the FD and the amplifying transistor GQ constitute the pixel circuit K2 separate from the pixel circuit K1 and arranged in a region D3. The region D3 is, for example, a rectangular region provided adjacent to the lower side of the pixel row 23 and having a horizontal width substantially equal to that of the pixel row 23.

Thus, the area of the regions D2 can be made smaller than in the conventional construction and the regions D1, i.e. the light receiving regions of the photoelectric conversion elements PD can be made larger by that much. As a result, even if the size of the respective pixels G is reduced, sufficient light receiving regions of the photoelectric conversion elements PD can be ensured. This enables more photons to be taken in and can suppress a reduction in the sensitivity of the pixel array 2.

The pixel circuits K1 excluding the photoelectric conversion elements PD, are arranged utilizing spaces (regions shown by W2 in FIG. 2) formed between the pixel rows 21 to 23. By this construction, a sufficiently large ratio of the vertical width (shown by W1 in FIG. 1) of the light receiving regions of the photoelectric conversion elements PD to the vertical interval (shown by W in FIG. 2) of the pixel rows 21 to 23 can be ensured.

Since the reset transistors RQ and the amplifying transistors GQ arranged in the respective pixels G in the conventional construction are arranged in the pixel circuits K2 and shared by the pixel rows 21 to 23, a row selection control can be executed only by the transfer transistors TQ, thereby making it possible to omit row selection transistors conventionally arranged in the respective pixels. Thus, the number of wirings for the respective pixels G is drastically reduced. As a result, a ratio of the light receiving region of the photoelectric conversion element PD in each pixel increases and sensitivity is improved.

Further, each pixel circuit K2 is shared by the respective columns. Thus, as compared with the conventional construction in which the reset transistor RQ, the FD and the amplifying transistor GQ are provided in each pixel, the number of these devices can be drastically reduced, whereby a cost reduction can be promoted and, simultaneously, the size of the pixel array 2 can be reduced.

Furthermore, since the transfer transistor TQ has the row selection function, the row selection transistor SQ shown in FIG. 11 becomes unnecessary, wherefore a further reduction of the circuit size can be promoted.

Figure 4:
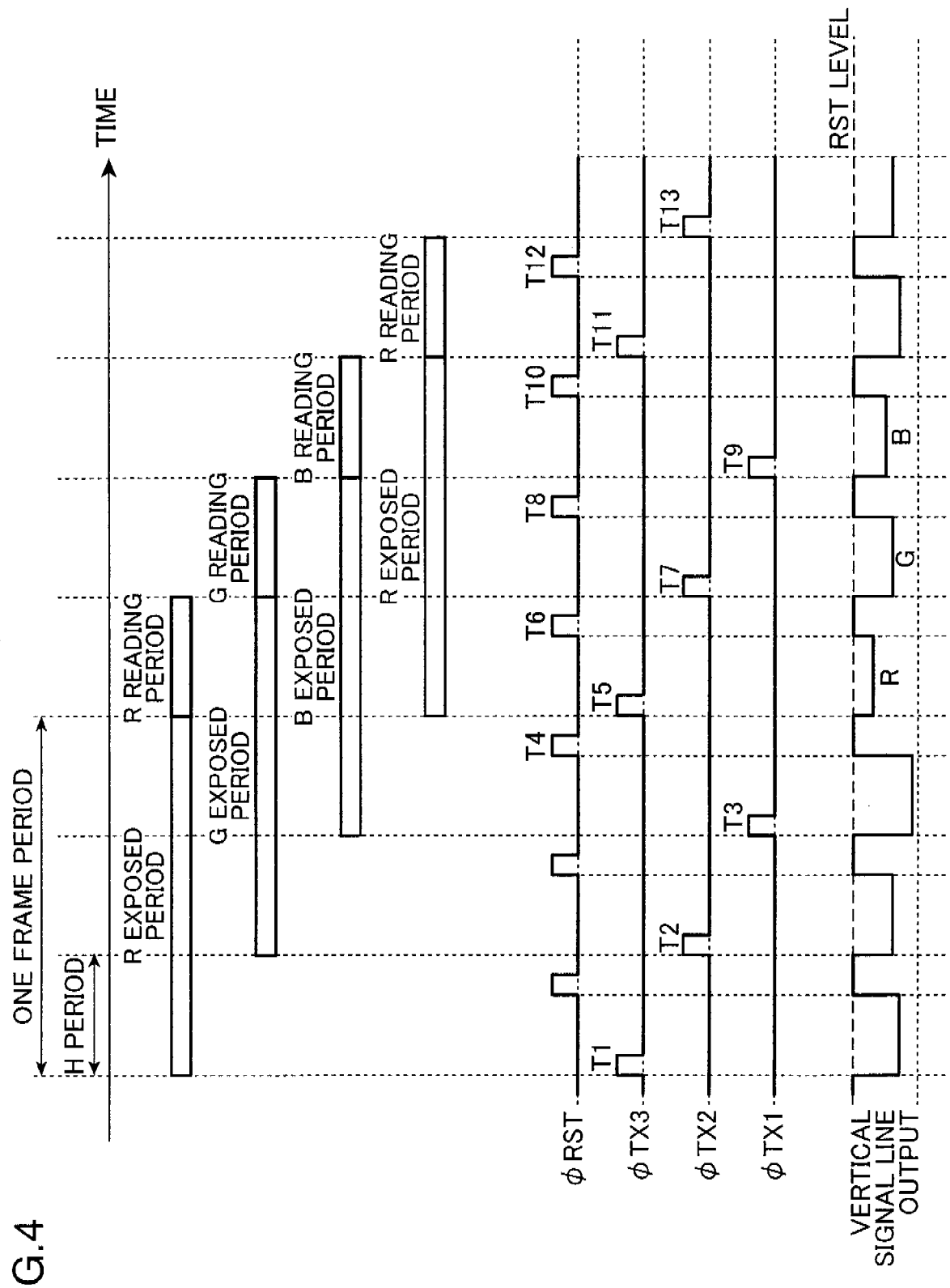
FIG. 4 is a timing chart showing the operation of the image pickup apparatus according to the first embodiment of the invention.
Figure 5:
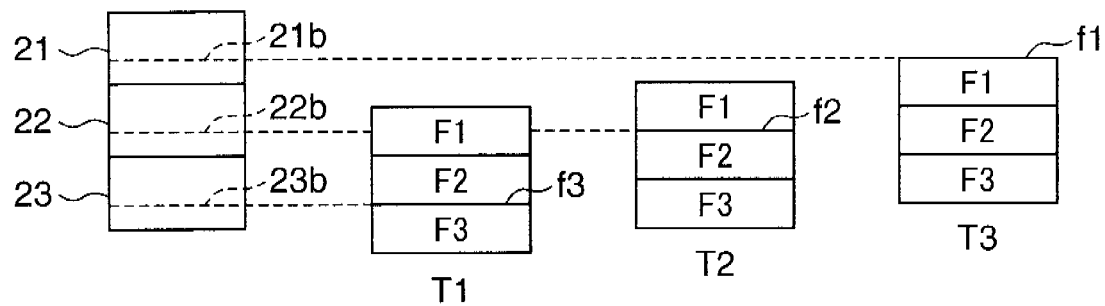
FIG. 5 is a diagram showing a relationship between pixel rows and frames of a document.

FIG. 4 is a timing chart showing the operation of the image pickup apparatus 1 according to the first embodiment of the present invention. FIG. 5 is a diagram showing a relationship between the pixel rows 21 to 23 and frames F1 to F3 of a document. The operation of the image pickup apparatus 1 is described below with reference to FIGS. 4 and 5. In FIG. 4, the image pickup apparatus 1 is assumed to scan an object vertically conveyed from the lower side toward the upper side in FIG. 1.

An H-period (horizontal scanning period) shown in FIG. 4 is a period necessary to read the pixel data of one pixel row. A one-frame period is a period necessary to read all the image data of the pixel array 2. Since the pixel array 2 is composed of three pixel rows 21 to 23 in this embodiment, the one-frame period is a period which is three times as long as one H period. If i (i is an integer equal to or greater than 2) pixel rows are present, the one-frame period is the i-fold of one H period.

First of all, when φTX3 is turned on at time T1 shown in FIG. 4, the pixel row 23 starts reading the frame F3. At this time, as shown in FIG. 5, a leading end f3 of the frame F3 has already reached rear ends 23b of the regions D1 of the pixel row 23.

Subsequently, φTX2 is turned on at time T2 after the lapse of one H period from time T1 shown in FIG. 4 and the pixel row 22 starts reading the frame F2. At this time, as shown in FIG. 5, a leading end f2 of the frame F2 has already reached rear ends 22b of the regions D1 of the pixel row 22.

Subsequently, φTX1 is turned on at time T3 after the lapse of one H period from time T2 shown in FIG. 4 and the pixel row 21 starts reading the frame F1. At this time, as shown in FIG. 5, a leading end f1 of the frame F1 has already reached rear ends 21b of the regions D1 of the pixel row 21.

Subsequently, at time T4, φRST is turned on, the reset transistors RQ shown in FIG. 3 are turned on, the FDs are reset and pixel signals of a reset level (RST level) are output from the vertical signal lines L2. The reading circuits 5 read these pixel signals as noise components and hold them as samples in the noise sample hold capacitors C2.

Subsequently, at time T5, φTX3 is turned on, the transfer transistors TQ in the third row in FIG. 3 are turned on and the signal charges accumulated by the photoelectric conversion elements PD are transferred. In this way, pixel signals reduced from the RST level by a level corresponding to the signal charges are output from the vertical signal lines L2. Then, the reading circuits 5 read these pixel signals as noise components plus signal components and hold them as samples in the signal sample hold capacitors C1.

By the above, the pixel signals of R of the frame F3 read during a R exposed period from time T1 to time T5 are read during a R reading period from time T5 to time T6.

Subsequently, at time T6, φRST is turned on, the FDs are reset, and pixel signals of the RST level are output as noise components from the vertical signal lines L2. Subsequently, at time T7, φTX2 is turned on and the signal charges are transferred to the FDs by the transfer transistors TQ in the second row shown in FIG. 3. In this way, pixel signals reduced from the RST level by a level corresponding to the signal charges are output from the vertical signal lines L2. By the above, the pixel signals of G of the frame F2 read during a G exposed period from time T2 to time T7 are read during a G reading period from time T7 to time T8.

Thereafter, pixel signals of B of the frame F1 read during a B exposed period from time T3 to time T9 are similarly read during a B exposed period from time T9 to time T10. By repeating the above operations, the object is scanned.

As described above, according to the image pickup apparatus 1, the pixel circuit arranged in each pixel in the conventional construction is divided into the pixel circuit K1 that cannot be shared by the respective columns and the pixel circuit K2 that can be shared by the respective columns. The pixel circuits K1 are arranged in the respective pixel G and the pixel circuits K2 are arranged in the region D3 outside the pixel rows 21 to 23.

In other words, by arranging the pixel circuits K2, which can be shared by the respective columns, outside the pixel rows, the number of the transistors constituting the pixel circuits K1 can be reduced, the number of wirings for the respective pixels G can be drastically reduced and the sufficient light receiving regions of the photoelectric conversion elements PD can be ensured in the respective pixels G even if the size of the respective pixels G is reduced. As a result, the ratio of the light receiving region of the photoelectric conversion element PD in each pixel G can be increased to improve sensitivity.

Second Embodiment

Figure 6:
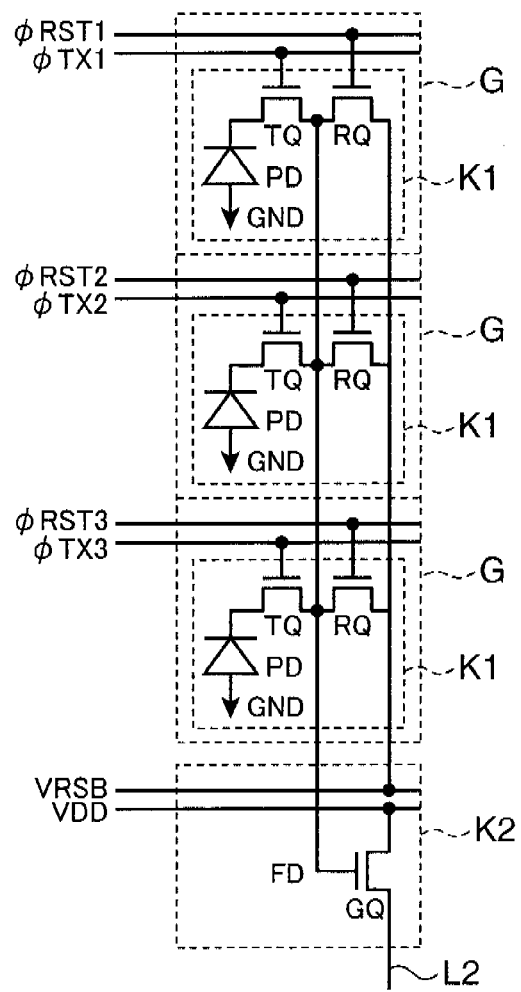
FIG. 6 is a circuit diagram of a pixel of an image pickup apparatus according to a second embodiment of the invention.

A pixel array 2 of an image pickup apparatus 1 according to a second embodiment differs from the first embodiment in the constructions of pixel circuits K1, K2. FIG. 6 is a circuit diagram of pixels G of the image pickup apparatus 1 according to the second embodiment of the present invention. In this embodiment, the same elements as in the first embodiment are not described.

As shown in FIG. 6, a reset transistor RQ is provided in the pixel circuit K1 in this embodiment. In other words, there are as many reset transistors RQ as the pixels G. Thus, although there is one type of φRST in the first embodiment, there are three types of φRST1 to φRST3 corresponding to the first to third rows. Therefore, three signal lines corresponding to the respective rows are provided to permit the flow of φRST1 to φRST3.

Figure 7:
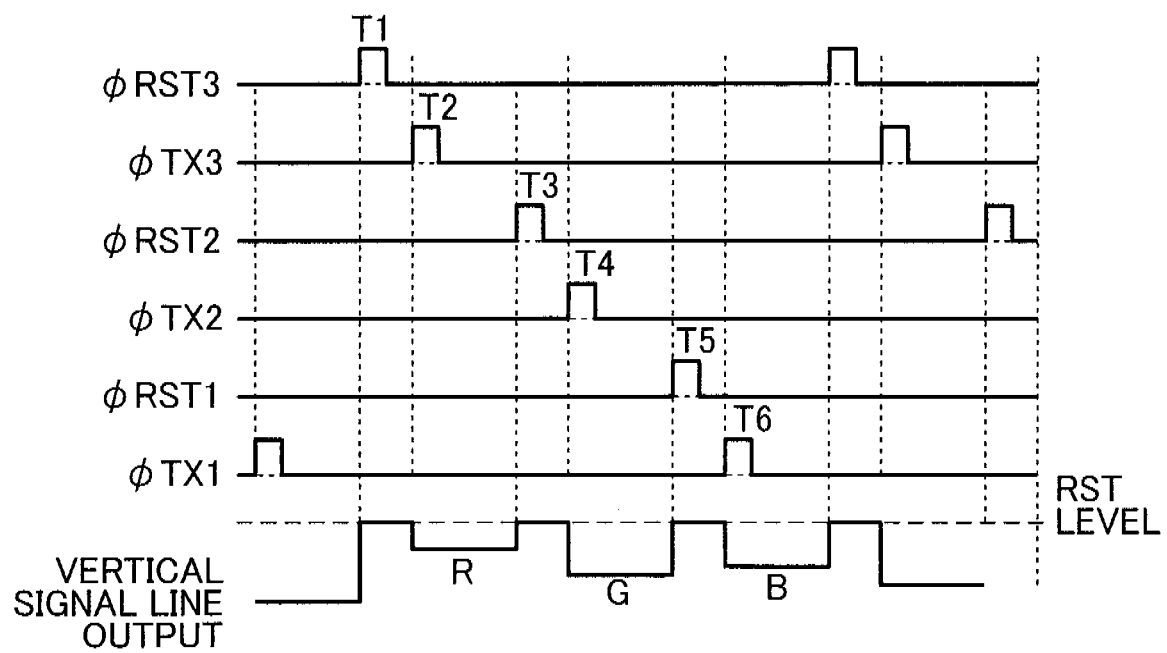
FIG. 7 is a timing chart showing the operation of the image pickup apparatus according to the second embodiment of the invention.

FIG. 7 is a timing chart showing the operation of the image pickup apparatus 1 according to the second embodiment. First of all, at time T1, φRST3 is turned on, the reset transistors RQ in the third row shown in FIG. 6 are turned on and FDs are reset. In this way, pixel signals of an RST level are output as noise components of R pixel signals from vertical signal line L2.

Subsequently, at time T2, φTX3 is turned on, transfer transistors TQ in the third row shown in FIG. 6 are turned on and signal charges accumulated by photoelectric conversion elements PD are transferred to the FD. In this way, pixel signals reduced from the RST level by a level corresponding to the signal charges are output as noise components plus signal components of R pixel signals from the vertical signal lines L2.

At time T3, φTX2 is turned on, reset transistors RQ in the second row shown in FIG. 6 are turned on and the FDs are reset. In this way, pixel signals of the RST level are output as noise components of G pixel signals from the vertical signal lines L2.

Subsequently, at time T4, φTX2 is turned on, transfer transistors TQ in the second row shown in FIG. 6 are turned on and signal charges accumulated by photoelectric conversion elements PD are transferred to the FDs. In this way, pixel signals reduced from the RST level by a level corresponding to the signal charges are output as noise components plus signal components of G pixel signals from the vertical signal lines L2.

Subsequently, when φRST1 is turned on at time T5, noise components of B pixel signals are output from the vertical signal lines L2 as at times T1 and T3. Subsequently, when φTX1 is turned on at time T6, noise components plus signal components of the B pixel signals are output from the vertical signal lines L2 as at times T2 and T4.

As described above, according to the image pickup apparatus 1 of the second embodiment, the circuit size of the pixel circuit K2 can be reduced by as much as the omitted reset transistor RQ.

On the other hand, the circuit size of the pixel circuit K1 increases by as much as the added reset transistor RQ, but the FD, the row selection transistor SQ and the amplifying transistor GQ are omitted unlike the conventional pixel circuit shown in FIG. 11. Thus, even if the size of the respective pixels G is reduced, sufficient light receiving regions of the photoelectric conversion elements PD can be ensured and a reduction in the sensitivity of the pixel array 2 can be suppressed.

Third Embodiment

Figure 8:
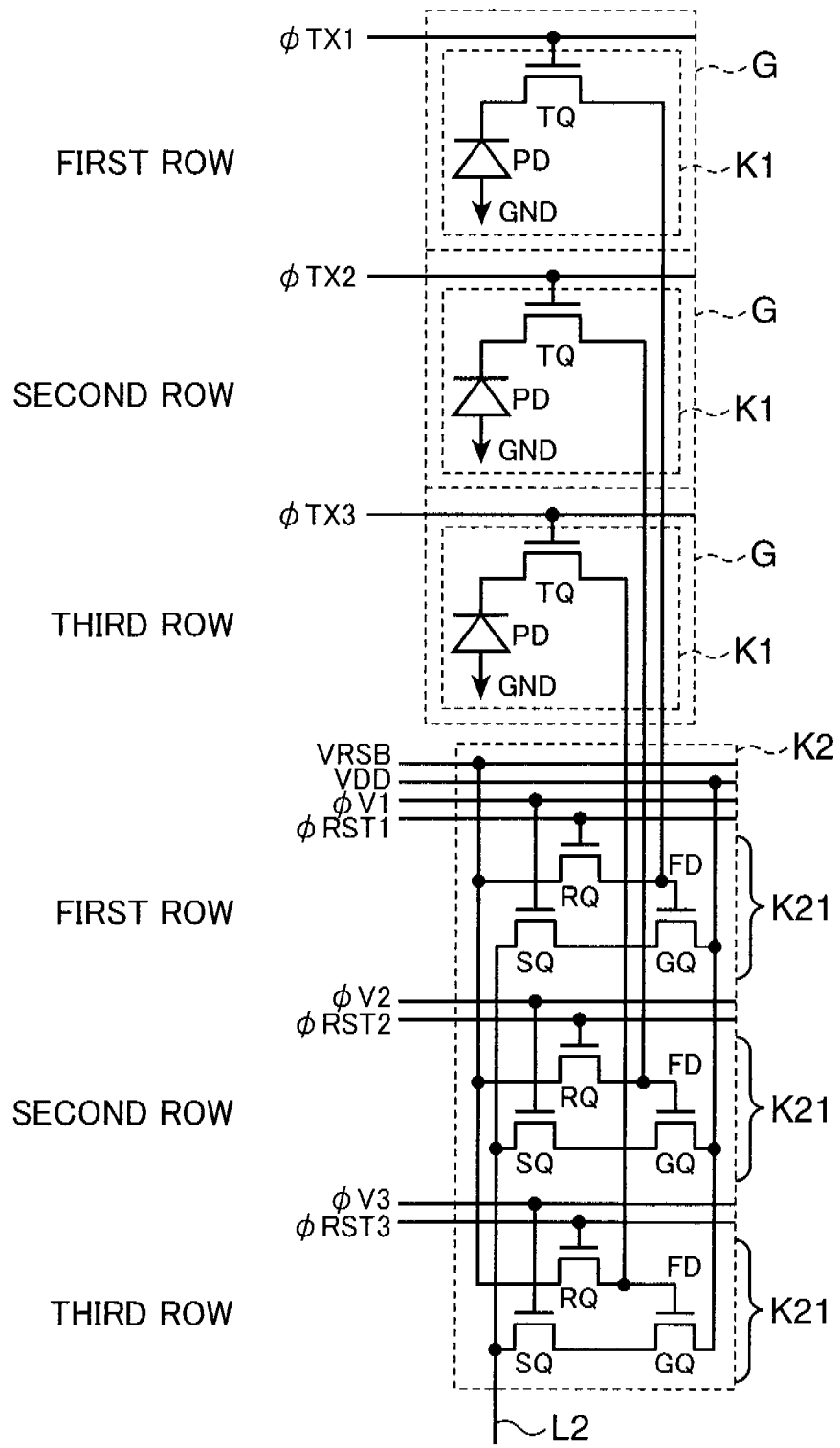
FIG. 8 is a circuit diagram of a pixel of an image pickup apparatus according to a third embodiment of the invention.

An image pickup apparatus 1 of a third embodiment differs from the first and second embodiments in the constructions of pixel circuits K1, K2. FIG. 8 is a circuit diagram of pixels G1 of the image pickup apparatus 1 according to the third embodiment. The pixel circuits K1 have the same construction as the pixel circuits K1 of the first embodiment. In this embodiment, the same elements as in the first and second embodiments are not described.

The pixel circuit K2 includes three pixel circuits K21 corresponding to pixel rows 21 to 23. Each pixel circuit K21 includes a reset transistor RQ, an amplifying transistor GQ, an FD and a row selection transistor SQ.

The reset transistor RQ has φRST1 (φRST2, φRST3 to the reset transistors RQ in the second and third rows) as a signal for turning on and off the reset transistor RQ input to a gate thereof, has VRSB input to a source thereof and has a drain thereof connected to a gate of the amplifying transistor GQ via the FD.

The amplifying transistor GQ has a gate thereof connected to the reset transistor RQ via the FD, has VDD input to a source thereof and has a drain thereof connected to the row selection transistor SQ.

The row selection transistor SQ has φV1 (φV2, φV3 to the row selection transistors SQ in the second and third rows) as a signal for turning on and off the row selection transistor SQ input to a gate thereof, has a source thereof connected to the amplifying transistor GQ and has a drain thereof connected to a vertical signal line L2.

Figure 9:
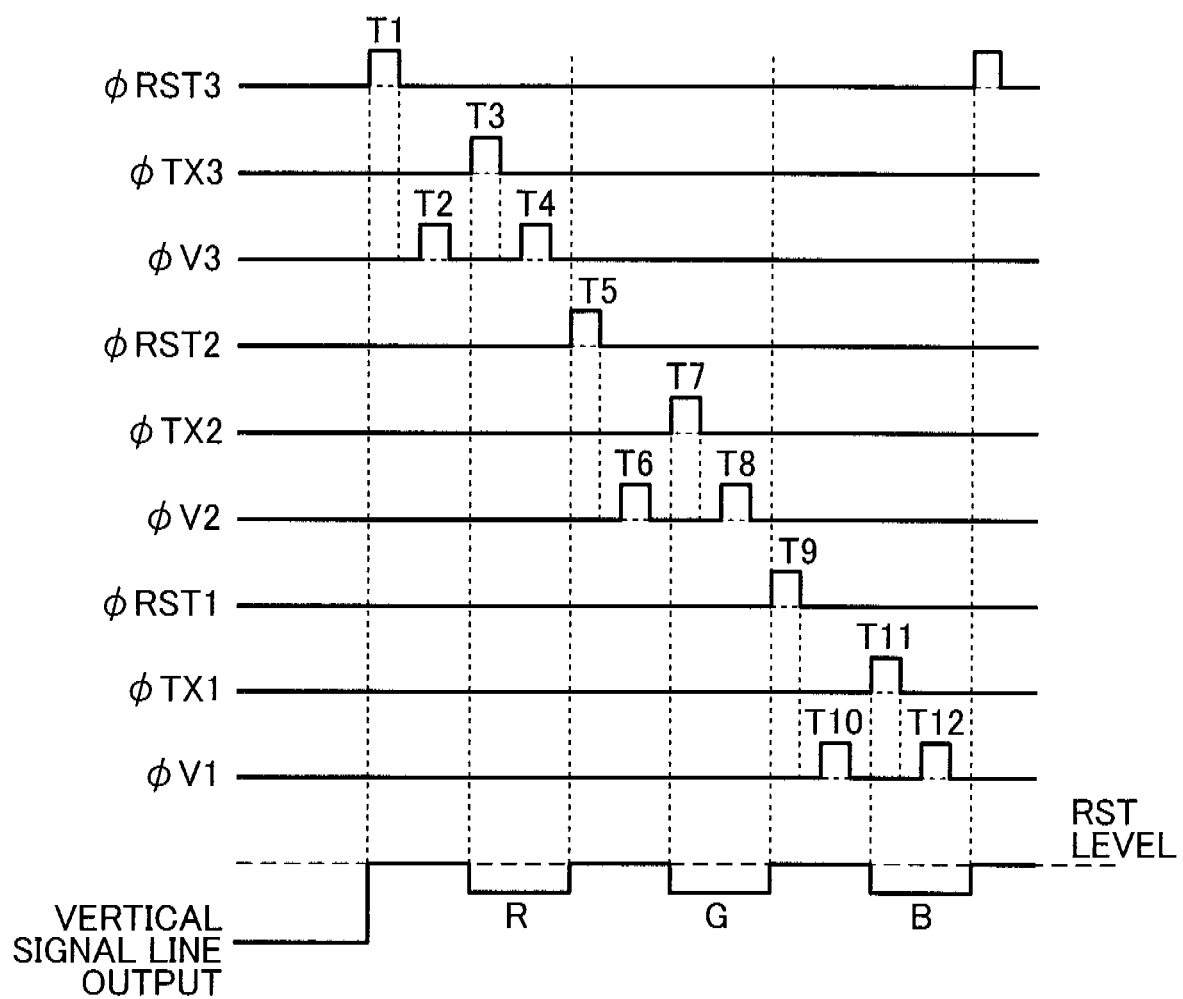
FIG. 9 is a timing chart showing the operation of the image pickup apparatus according to the third embodiment of the invention.

FIG. 9 is a timing chart showing the operation of the image pickup apparatus 1 according to the third embodiment of the present invention. First of all, at time T1, φRST3 is turned on, the reset transistors RQ in the third row shown in FIG. 8 are turned on and the FDs are reset.

Subsequently, at time T2, φV3 is turned on, the row selection transistors SQ in the third row shown in FIG. 8 are turned on and pixel signals of an RST level are output as noise components of R pixel signals.

Subsequently, at time T3, φTX3 is turned on, the transfer transistors TQ in the third row shown in FIG. 8 are turned on and signal charges accumulated in photoelectric conversion elements PD are transferred to the FD.

Subsequently, at time T4, φV3 is turned on, the row selection transistors SQ in the third row shown in FIG. 8 are turned on and pixel signals reduced from the RST level by a level corresponding to the signal charges are output as noise components plus signal components of R pixel signals from the vertical signal lines L2.

Subsequently, at time T5, φRST2 is turned on, the reset transistors RQ in the second row shown in FIG. 8 are turned on and the FDs are reset.

Subsequently, at time T6, φV2 is turned on, the row selection transistors SQ in the second row shown in FIG. 8 are turned on and pixel signals of the RST level are output as noise components of G pixel signals.

Subsequently, at time T7, φTX2 is turned on, the transfer transistors TQ in the second row shown in FIG. 8 are turned on and signal charges accumulated in the photoelectric conversion elements PD are transferred to the FD.

Subsequently, at time T8, φV2 is turned on, the row selection transistors SQ in the second row shown in FIG. 8 are turned on and pixel signals reduced from the RST level by a level corresponding to the signal charges are output as noise components plus signal components of G pixel signals from the vertical signal lines L2.

At times T9 to T12, noise components and noise components plus signal components of B pixel signals are successively output from the vertical signal lines L2 as at times T1 to T4 or T5 to T8.

As described above, according to the image pickup apparatus 1 of the third embodiment, the circuit size of the pixel circuit K1 can be reduced since it is constructed by the transfer transistor TQ and the photoelectric conversion element PD. Thus, even if the size of the pixels G is reduced, sufficient light receiving regions of the photoelectric conversion elements PD can be ensured and a reduction in the sensitivity of the pixel array 2 can be suppressed.

Fourth Embodiment

Figure 10:
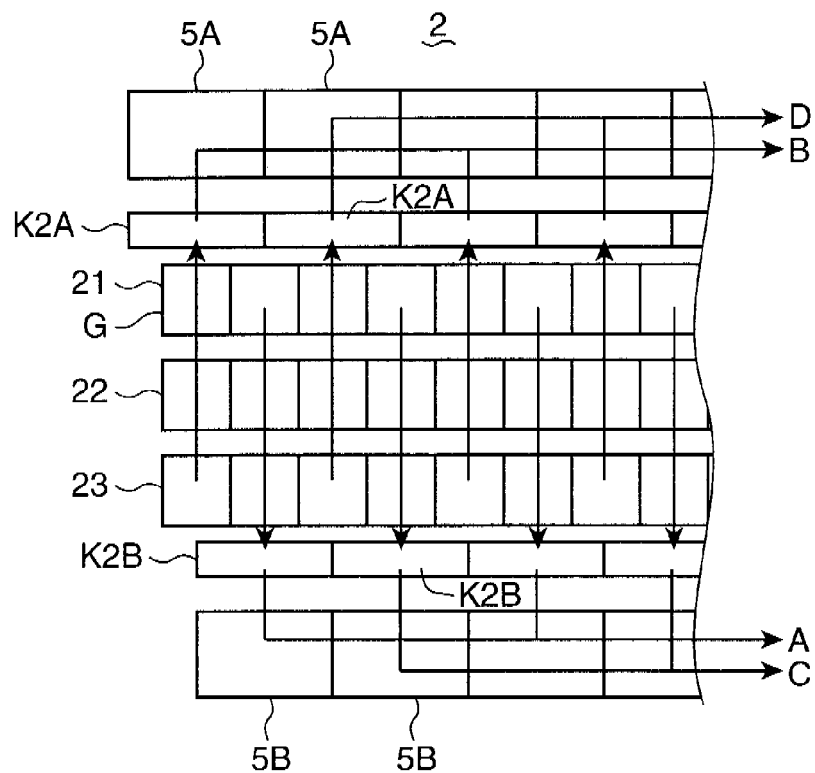
FIG. 10 is an overall construction diagram of a pixel array of an image pickup apparatus according to a fourth embodiment of the invention.

An image pickup apparatus 1 of a fourth embodiment differs from the first to third embodiments in the arrangement of the pixel circuits K2. FIG. 10 is an overall construction diagram of a pixel array 2 of the image pickup apparatus 1 according to the fourth embodiment of the present invention.

Pixel circuits K2A are provided to commonly correspond to odd-numbered pixel columns of the pixel array 2, for example, from the left. In other words, there are as many pixel circuits K2A as the odd-numbered pixel columns of the pixel array 2.

The pixel circuits K2A output pixel signals read by pixels G of the odd-numbered pixel columns in a row selected by a vertical scanning circuit 3 to reading circuits 5A.

Pixel circuits K2B are provided to commonly correspond to even-numbered pixel columns of the pixel array 2, for example, from the left. In other words, there are as many pixel circuits K2B as the even-numbered pixel columns of the pixel array 2.

The pixel circuits K2B output pixel signals read by pixels G of the even-numbered pixel columns in a row selected by a vertical scanning circuit 3 to reading circuits 5B.

The construction of the pixel circuits K2 of the first to third embodiments may be employed as the construction of the pixel circuits K2A, K2B.

A plurality of reading circuits 5A are arranged above the pixel circuits K2A in correspondence with the pixel circuits K2A to read the pixel signals output from the pixel circuits K2A. A plurality of reading circuits 5B are arranged below the pixel circuits K2B in correspondence with the pixel circuits K2B to read the pixel signals output from the pixel circuits K2B.

A construction identical to that of the reading circuits 5 may be employed as the construction of the reading circuits 5A, 5B.

The image pickup apparatus 1 thus constructed operates as follows. First of all, when the pixel rows are selected by the vertical scanning circuit 3, the pixel circuits K2A output pixel signals read by the pixels G of the odd-numbered pixel columns to the corresponding reading circuits 5A.

Simultaneously, the pixel circuits K2B output pixel signals read by the pixels G of the even-numbered pixel columns to the corresponding reading circuits 5B.

Subsequently, the reading circuits 5A, 5B remove noise components from the read pixel signals and successively output the pixel signals of the respective pixels G. In this case, the pixel signals of the respective pixels G may be output such that the reading circuits 5A output the pixel signals of the pixels G in the first column at the same time when the reading circuits 5B output the pixel signals of the pixels G in the second column, and the reading circuits 5A output the pixel signals of the pixels G in the third column at the same time when the reading circuits 5B output the pixel signals of the pixels G in the fourth column.

In this way, a time required by the reading circuits 5A, 5B to output the pixel signals of one row can be half the time conventionally required, whereby the pixel signals can be read at a high speed.

The image pickup apparatuses 1 shown in the first to fourth embodiments may be embodied as follows.

(1) Although the pixel circuits K1, K2 are constructed by so-called 4Tr type pixel circuits each including the transfer transistor TQ in the above description, they are not limited to such a construction. For example, so-called 3 Tr type pixel circuits including no transfer transistor TQ may be employed.

(2) Although there are three pixel rows in the above description, the number of pixel rows is not limited to this and does not matter provided that it is 2 or greater.

(3) Although the pixel rows 21 to 23 are so arranged that the pixel positions of the respective rows are aligned in the above description, the arrangement is not limited to this. For example, any one (e.g. pixel row 22) of the pixel rows 21 to 23 may be horizontally displayed by a specified multiple of the arrangement pitch of the pixels in the horizontal direction, e.g., a half of the arrangement pitch. This enables the realization of the pixel array 2 having a quasi-honeycomb structure. If there are four or more pixel rows, the pixel rows may be arranged, for example, such that the even-numbered pixel rows are displaced by half the arrangement pitch of the pixels G in the horizontal direction with respect to the odd-numbered pixel rows.

(4) Although the vertical arrangement pitch T of the pixel rows 21 to 23 is $(4/3) \cdot W1$ in the above embodiment, it is not limited to such a pitch and may, for example, be such that $T<(4/3) \cdot W1$. If there are n pixel rows, T may be such that $T<((n+1)/n) \cdot W1$. This can further increase the sensitivity of the pixel array 2.

(5) In the pixel circuits K2 of the first and second embodiments each including the common FD, at least two of $\phi TX1$ to $\phi TX3$ may be simultaneously turned on. In this way, the pixel signals output from at least two pixels G in the same column are added and output from the vertical signal line L2, wherefore the sensitivity can be further increased.

(6) In the pixel circuits K2 of the first and second embodiments each including the common FD, a TDI (Time Delayed Integration) control may be applied. In this case, for example, the pixel rows 21 to 23 are first caused to read the same frame of an object by adjusting on/off timings of $\phi TX1$ to $\phi TX3$.

The reading circuits 5 add and output the pixel signals of the same frame read by the pixel rows 21 to 23. This enables a moving frame to be read with good sensitivity.

A TDI control, for example, disclosed at http://jp.hamamatsu.com/products/sensor-ssd/pd101/pd457/index-_ja.html or http://jp.hamamatsu.com/resources/products/ssd/pdf/tdi-ccd_kmpd9004j01.pdf may be employed.

Technical features of the above-described device are summarized as follows.

(1) The above solid-state image sensing device is a CMOS solid-state image sensing device in which a plurality of pixel rows each including a plurality of linearly arranged pixels are arranged and comprises first pixel circuits individually provided for the respective pixels and arranged in the respective pixels; and second pixel circuits commonly provided for the pixels of respective columns, wherein the second pixel circuits are arranged outside the pixel rows.

According to this construction, pixel circuits arranged in respective pixels in the conventional construction are divided into the first pixel circuits that cannot be shared by the respective columns and the second pixel circuits that can be shared by the respective columns. The first pixel circuits are arranged in the respective pixels and the second pixel circuits are arranged outside the pixel rows. Thus, the first pixel circuits have a smaller circuit size as compared with the conventional pixel circuits and take up a smaller area in the respective pixels.

Specifically, by arranging the second pixel circuits, which can be shared by the respective columns, outside the pixel rows, the number of transistors constituting the first pixel circuit can be reduced, the number of wirings for the respective pixels can be drastically reduced, and sufficient light receiving regions can be ensured for photoelectric conversion elements even if the size of the respective pixels is reduced. As a result, a take-up ratio of the light receiving region of the photoelectric conversion element in each pixel can be increased to improve sensitivity.

By arranging the first pixel circuits excluding the photoelectric conversion elements utilizing spaces formed between the pixel rows, a sufficient ratio of a vertical width of the light receiving regions of the photoelectric conversion elements PD to a vertical pitch of the pixel rows can be ensured.

(2) In the above solid-state image sensing device, each first pixel circuit preferably includes a photoelectric conversion element for accumulating signal charges by exposing an object with light and a transfer transistor for transferring the signal charges accumulated by the photoelectric conversion element.

According to this construction, the first pixel circuit is composed of the photoelectric conversion element and the transfer transistor. Thus, the circuit size of the first pixel circuit can be drastically reduced as compared with conventional pixel circuits.

(3) In the above solid-state image sensing device, each second pixel circuit preferably includes a floating diffusion for accumulating the signal charges transferred from the transfer transistor, a reset transistor for resetting the floating diffusion and an amplifying transistor for amplifying the signal charges accumulated in the floating diffusion and outputting them as a pixel signal.

According to this construction, the floating diffusion is reset by the reset transistor, the signal charges are accumulated by the reset floating diffusion, and the signal charges accumulated in the floating diffusion are amplified and output as a pixel signal by the amplifying transistor. Thus, the pixel signal can be reliably taken from the second pixel circuit.

(4) In the above solid-state image sensing device, a row selection signal used to select each row is preferably input to the transfer transistor from a vertical scanning circuit.

According to this construction, since the transfer transistor transfers the signal charges accumulated in the photoelectric conversion element in accordance with the row selection signal, a row selection transistor is not necessary unlike conventional pixel circuits and the circuit size of the first or second pixel circuits can be further reduced.

(5) In the above solid-state image sensing device, each first pixel circuit includes a reset transistor for resetting the floating diffusion.

According to this construction, since the reset transistor is arranged in the first pixel circuit, the circuit size of the first pixel circuits can be made smaller as compared with the conventional pixel circuits and, at the same time, the circuit size of the second pixel circuits can be reduced.

(6) In the above solid-state image sensing device, each second pixel circuit preferably includes a floating diffusion for accumulating the signal charges transferred from the transfer transistor, a reset transistor for resetting the floating diffusion, an amplifying transistor for amplifying the signal charges accumulated in the floating diffusion, and a row selection transistor, to which a row selection signal used to select each row is input from a vertical scanning circuit and which is adapted to output the signal charges amplified by the amplifying transistor as a pixel signal.

According to this construction, the floating diffusion is reset by the reset transistor, the signal charges are accumulated by the reset floating diffusion, and the signal charges accumulated in the floating diffusion are amplified by the amplifying transistor and output as the pixel signal via the row selection transistor. Thus, the pixel signal can be reliably taken from the second pixel circuit.

(7) The above image pickup apparatus comprises the above solid-state image sensing device.

According to this construction, there can be provided an image pickup apparatus including a solid-state image sensing device which can increase a take-up ratio of a light receiving region of a photoelectric conversion element in each pixel to improve sensitive even if the size of the respective pixels are reduced.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A solid-state image sensing device having a plurality of pixel rows and columns, each pixel row including a plurality of linearly arranged pixels, comprising: first pixel circuits individually provided for respective pixels and located in each of the respective pixels, the first pixel circuits each comprising a photoelectric conversion element for receiving light from an object and for accumulating signal charges, and a transfer transistor for transferring the signal charges accumulated by the photoelectric conversion element;

a floating diffusion for accumulating the signal charges transferred from the transfer transistor; and second pixel circuits, each second pixel circuit being electrically connected to all of the first pixel circuits in only a single column of said first pixel circuits, the second pixel circuits comprising an amplifying transistor for amplifying the signal charges accumulated in the floating diffusion, the second pixel circuits being located outside, and not between or among, the pixel rows.

2. The solid-state image sensing device according to claim 1, wherein each second pixel circuit further comprises:
the floating diffusion; and
a reset transistor for resetting the floating diffusion.

3. The solid-state image sensing device according to claim 2, wherein each second pixel circuit further comprises:
a row selection transistor, to which a row selection signal used to select each row of said plurality of pixel rows is input from a vertical scanning circuit and which is adapted to output the signal charges amplified by the amplifying transistor as a pixel signal.

4. The solid-state image sensing device according to claim 1, wherein a row selection signal used to select each row of said plurality of pixel rows is input to the transfer transistor from a vertical scanning circuit.

5. The solid-state image sensing device according to claim 1, wherein each first pixel circuit comprises a reset transistor for resetting the floating diffusion.

6. The solid-state image sensing device according to claim 1, which is a CMOS device.

7. An image pickup apparatus comprising a solid-state image sensing device according to claim 1.

8. The solid-state image sensing device according to claim 1, wherein each photoelectric conversion element is located in a first region within a respective pixel, each transfer transistor is located in a second region within a respective pixel, the first regions of the pixels are arranged in rows, the second regions of the pixels are arranged in rows, and the second pixel circuits are arranged in rows.

* * * * *